(12) United States Patent
Pearce

(10) Patent No.: US 7,638,380 B2
(45) Date of Patent: Dec. 29, 2009

(54) METHOD FOR MANUFACTURING A LATERALLY DIFFUSED METAL OXIDE SEMICONDUCTOR DEVICE

(75) Inventor: Charles W. Pearce, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 2060 days.

(21) Appl. No.: 09/755,828

(22) Filed: Jan. 4, 2001

(65) Prior Publication Data
US 2001/0049172 A1    Dec. 6, 2001

Related U.S. Application Data

(60) Provisional application No. 60/174,549, filed on Jan. 5, 2000.

(51) Int. Cl.
*H01L 21/336* (2006.01)

(52) U.S. Cl. .............. 438/197; 438/542; 438/585; 257/E21.001

(58) Field of Classification Search ............ 438/197, 438/138, 268, 270, 279, 226, 297, 528, 527, 438/545, 542, 585
See application file for complete search history.

(56) References Cited

U.S. PATENT DOCUMENTS

| | | |
|---|---|---|
| 6,255,154 B1 | 7/2001 | Akaishi et al. |
| 2004/0087120 A1* | 5/2004 | Feudel et al. ............... 438/525 |

\* cited by examiner

*Primary Examiner*—Jack Chen

(57) ABSTRACT

A laterally diffused metal oxide semiconductor (LDMOS) device and a method of manufacture therefor. The method of manufacturing the LDMOS device includes forming an amorphous region in a semiconductor substrate between isolation structures and adjacent a gate structure, by implanting an amorphizing element, such as silicon or germanium, in the semiconductor substrate. The method further includes diffusing a channel dopant laterally in the amorphous region, to form a first portion of a channel.

20 Claims, 8 Drawing Sheets

METHOD FOR MANUFACTURING A LATERALLY DIFFUSED METAL OXIDE SEMICONDUCTOR DEVICE

CROSS-REFERENCE TO PROVISIONAL APPLICATION

This application claims the benefit of U.S. Provisional Application No. 60/174,549, entitled "INTEGRATED CIRCUIT AND A METHOD OF MAKING AN INTEGRATED CIRCUIT," to Charles Walter Pearce, filed on Jan. 5, 2000, which is commonly assigned with the present invention and incorporated herein by reference as if reproduced herein in its entirety.

TECHNICAL FIELD OF THE INVENTION

The present invention is directed, in general, to a semiconductor device and, more specifically, to a laterally diffused metal oxide semiconductor (LDMOS) device and a method of manufacture therefor.

BACKGROUND OF THE INVENTION

Power semiconductor devices are currently being used in many applications, either as discrete components or integrated with other transistors as an integrated circuit. Such power devices include high-voltage integrated circuits which typically include one or more high-voltage transistors, often on the same chip as low-voltage circuitry. A commonly used high-voltage component for these circuits is a laterally diffused metal oxide semiconductor (LDMOS) transistor. High-power applications have called for the use of such lateral double diffused MOS transistors primarily because they possess lower "on" resistance, $R_{DS}$ (on), faster switching speed, and lower gate drive power dissipation than their bipolar counterparts. However, these devices have heretofore also been strongly associated with bi-polar based process flows when integrated into a Bi-CMOS environment.

LDMOS transistors used in the high-voltage integrated circuits may generally be fabricated using some of the same techniques used to fabricate low voltage circuitry or logic circuitry. In general, LDMOS structures are fabricated in a thick epitaxial layer of the same or opposite conductivity type as the substrate. The epitaxial layer helps to equally distribute the applied drain voltage laterally across the silicon surface.

Typically, in a step subsequent to the formation of the epitaxial layer, a gate structure is formed over the epitaxial layer and a drain region dopant, such as phosphorous or arsenic, is laterally diffused under the gate structure. Diffusing the drain region dopant generally requires a masking step that masks all regions of the device except for the drain region and the gate structure. In addition to laterally diffusing the drain region dopant, a source region dopant, such as boron, is laterally diffused under the other side of the gate structure. An additional masking step, similar to the masking step previously described, is also required when laterally diffusing the source region dopant. Subsequent to laterally diffusing the source and drain region dopants, a higher concentration dopant may be diffused within the device.

The previously described method of manufacturing an LDMOS device is extensively used and well accepted, however, it experiences certain drawbacks. One drawback currently experienced during manufacturing LDMOS devices is an uncontrollable diffusion of the boron implant, resulting from variations in a desired implanted profile. Typically, the problem is a result of the fairly high kinetic energy imparted on the boron implanted atoms, and collisions that occur between such atoms in a lattice of the substrate material. These collisions tend to cause a portion of the boron implanted atoms to locate in an undesirable region of the device in a process called channeling. Typically the uncontrollable diffusion occurs in both the vertical and horizontal planes resulting in a structure that is substantially different than designed. The uncontrollable diffusion, if extreme enough, may also cause device failure.

Accordingly, what is needed in the art is a method of manufacturing an LDMOS device that does not experience the uncontrollable diffusion issues associated with the prior art methods of manufacturing LDMOS devices.

SUMMARY OF THE INVENTION

To address the above-discussed deficiencies of the prior art, the present invention provides a laterally diffused metal oxide semiconductor (LDMOS) device and a method of manufacture therefor. The method of manufacturing the LDMOS device includes forming an amorphous region in a semiconductor substrate between isolation structures and adjacent a gate structure, by implanting an amorphizing element, such as silicon or germanium, in the semiconductor substrate. The method further includes diffusing a channel dopant from the amorphous region, wherein the channel dopant is used to form a first portion of a channel. It should be realized that a subsequent heat treatment of the device structure may anneal out the amorphous region.

The present invention therefore introduces a method for manufacturing an LDMOS device that does not experience uncontrollable boron diffusion, as experienced using the prior art methods. Moreover, the inclusion of the amorphizing element within the semiconductor substrate substantially reduces the number of silicon defects resulting from the prior art boron implants. As a result of the present invention, more reliable and cost efficient LDMOS devices may be manufactured.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGUREs. It is emphasized that in accordance with the standard practice in the semiconductor industry the various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
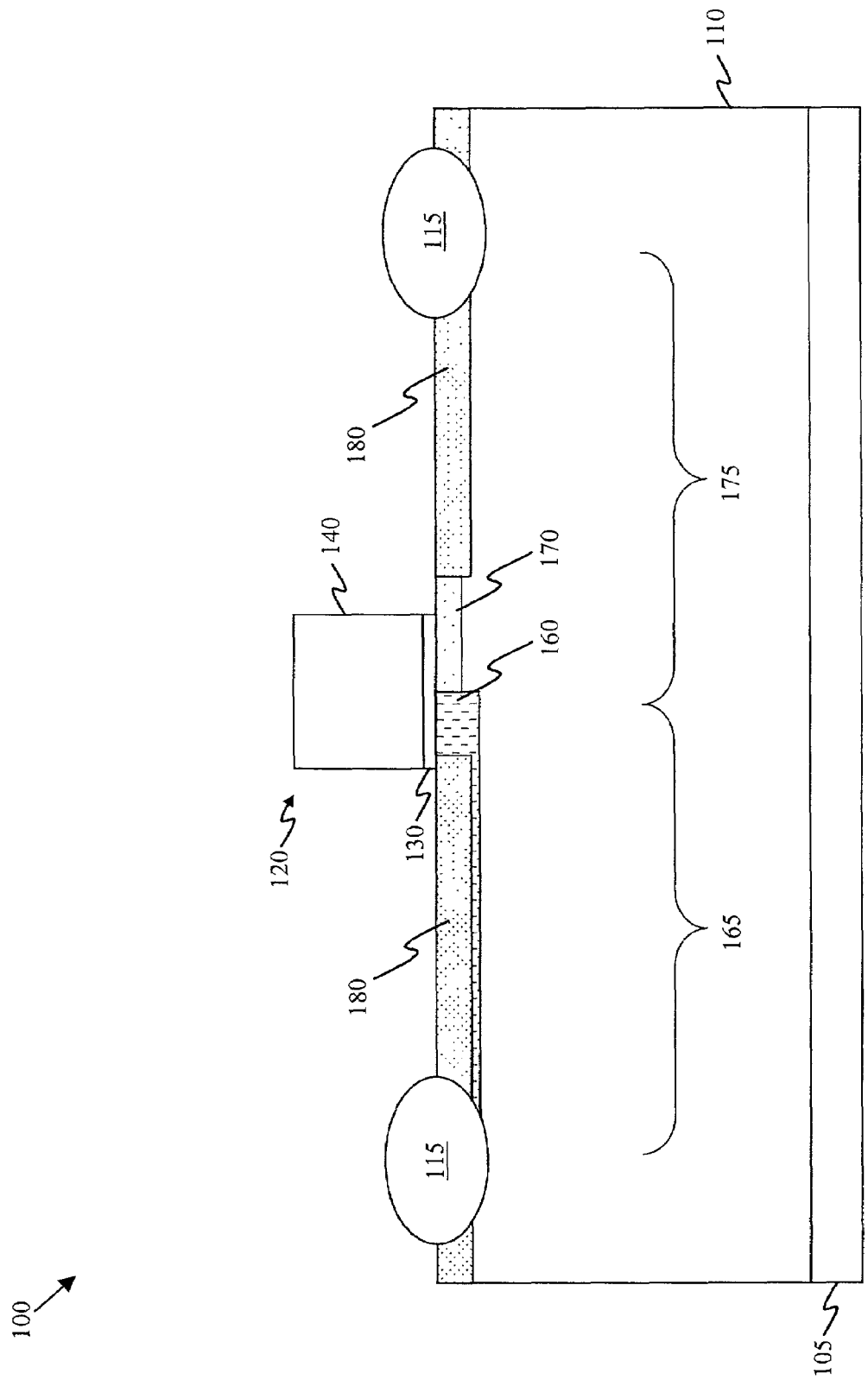
FIG. 1 illustrates a cross-sectional view of a completed laterally diffused metal oxide semiconductor (LDMOS) device manufactured by the method described herein.

Referring initially to FIG. 1, illustrated is a cross-sectional view of a completed laterally diffused metal oxide semiconductor (LDMOS) device 100 manufactured by the method described herein. The LDMOS device 100 includes a semiconductor wafer 105, a semiconductor substrate 110, and first and second isolation structures 115. It should be noted that the semiconductor substrate 110 may be any layer located in the LDMOS device 100, including the semiconductor wafer 105 or a layer located above the semiconductor wafer 105.

The LDMOS device 100 further includes a gate structure 120 located over the semiconductor substrate 110 and between the first and second isolation structures 115. The gate structure 120, in the illustrative embodiment, includes a conventional gate oxide 130 and poly gate 140. As illustrated, a channel dopant 160 is located on a side of the gate structure 165. Because of the unique method of manufacturing the LDMOS device 100, which will be discussed in greater detail below, the channel dopant 160 has a substantially ideal distribution.

The completed LDMOS device 100 may further include a source/drain dopant 170 located within the semiconductor substrate 110 and on another side of the gate structure 175. Furthermore, located on both sides of the gate structure 165, 175, is a heavy concentration of the source/drain implant 180.

The LDMOS device 100 manufactured according to the method described below does not experience the uncontrollable P-type dopant diffusion as experienced in the prior art devices. More specifically, the P-type dopants may be included within the LDMOS device, with a high degree of certainty that the P-type dopant is only located where desired, e.g., a substantially ideal distribution. Likewise, the LDMOS device 100 does not contain many of the crystal defects contained in the prior art devices. Furthermore, the method reduces many reliability issues, and is easy to adapt to the current manufacturing process.

Figure 2:
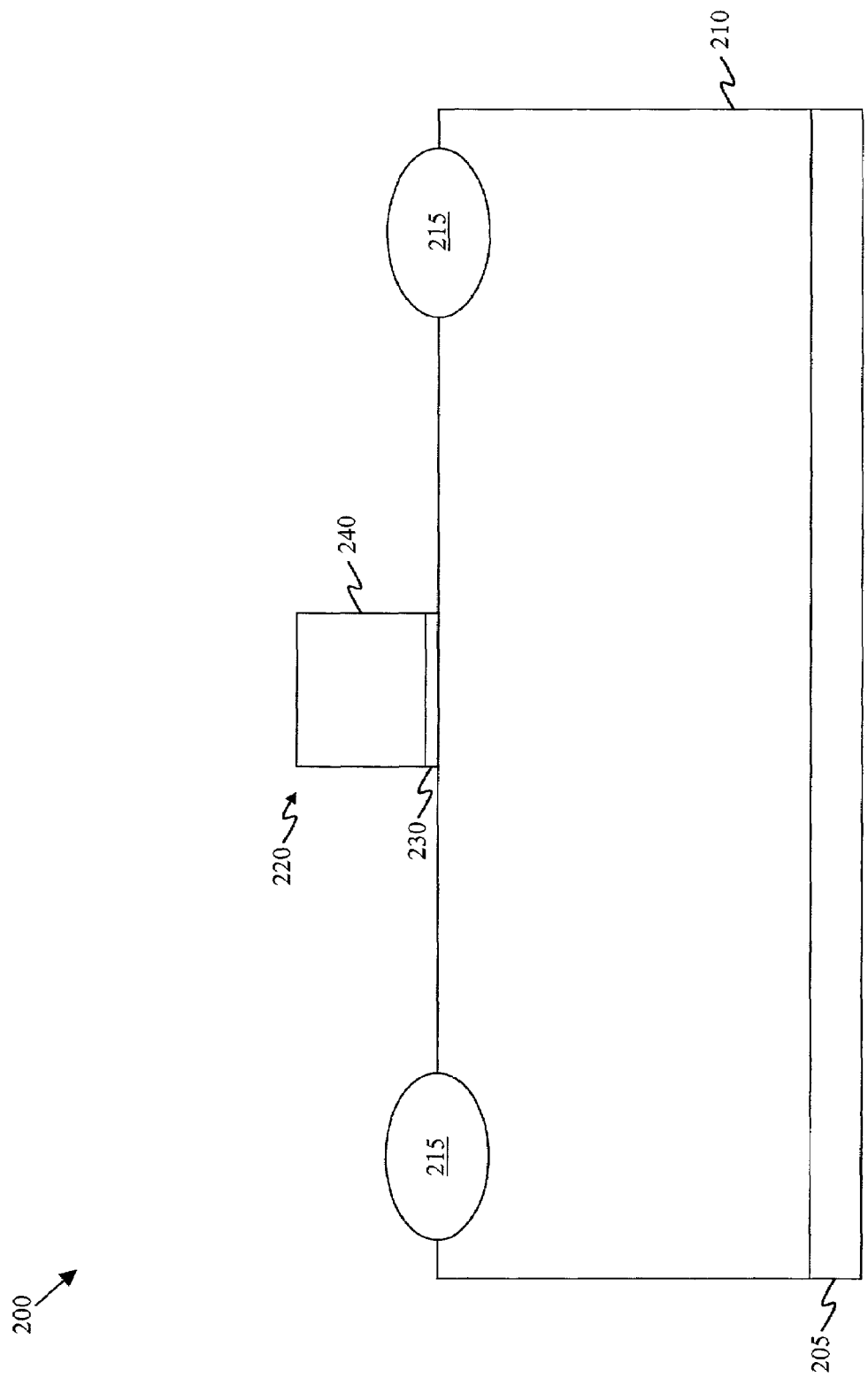
FIG. 2 illustrates a partially completed LDMOS device, including a semiconductor substrate.

Turning to FIGS 2-6, illustrated are various stages of manufacture of the completed LDMOS device 100 illustrated in FIG. 1. FIG. 2 illustrates a partially completed LDMOS device 200, including a semiconductor substrate 210. Located within the semiconductor substrate 210 are first and second isolation structures 215, formed in a prior step not shown. As illustrated, the isolation structures 215 are field oxides, however, it should be noted that any known or hereinafter discovered isolation structure 215 could be used.

Depending on whether the partially completed LDMOS device 200 is going to be a laterally diffused P-type metal oxide semiconductor (LDPMOS) device or a laterally diffused N-type metal oxide semiconductor (LDNMOS) device, the semiconductor substrate 210 is conventionally doped with phosphorous or boron, respectively. As illustrated, the semiconductor substrate 210 is a P-type doped semiconductor substrate.

Formed over the semiconductor substrate 210, in another step not shown, is a conventional gate structure 220. The conventional gate structure 220 may include a conventionally formed gate oxide 230 and poly gate 240. Forming the gate structure 220 uses many conventional processes known to those skilled in the art, including forming a blanket gate oxide layer and a blanket poly gate layer, depositing and patterning photoresist over the blanket poly gate layer, and etching those areas unprotected by photoresist to form the gate structure 220. Since many of the methods used to form the gate structure 220 are conventional, many of the other details regarding the formation of the gate structure 220 have been omitted.

Figure 3:
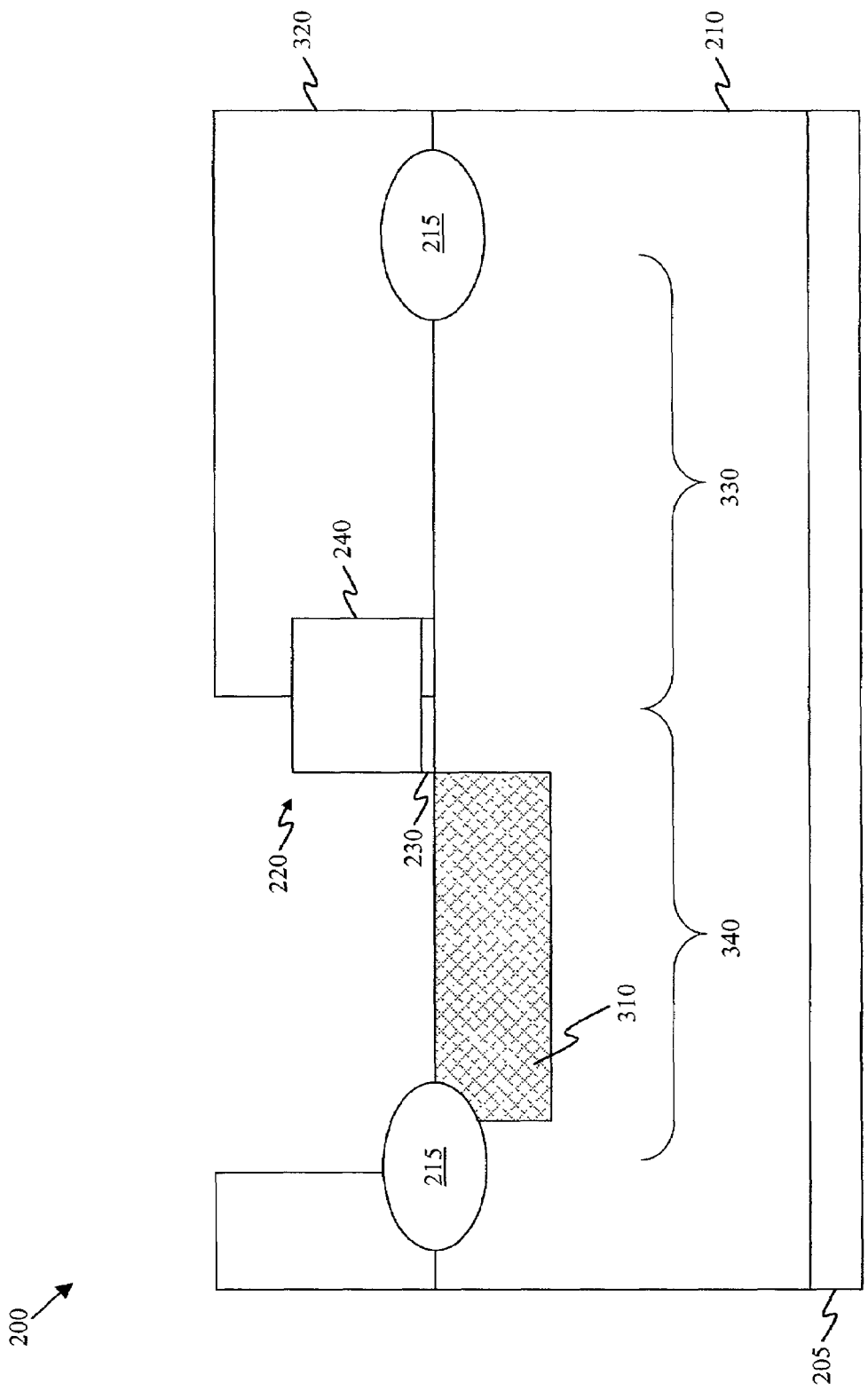
FIG. 3 illustrates the partially completed LDMOS device illustrated in FIG. 2 after forming photoresist portions and an amorphous region.

Turning to FIG. 3, illustrated is the partially completed LDMOS device 200 illustrated in FIG. 2 after forming an amorphous region 310. Prior to forming the amorphous region 310, photoresist portions 320 were formed on a first side of the gate structure 330, while leaving a second side of the gate structure 340 unprotected. One having skill in the art understands how to form the photoresist portion 320, including conventionally depositing a layer of photoresist material over a surface of the LDMOS device 200, patterning the layer of photoresist material by exposing certain portions of the photoresist layer to radiation, and washing the patterned layer leaving the photoresist portion 320.

Subsequent to forming the photoresist portions 320, the unprotected area of the semiconductor substrate 210 is implanted using an amorphizing element, thus forming the amorphous region 310. As illustrated, the amorphous region 310 is located in the semiconductor substrate 210, and extends from only one of the first and second isolation structures 215. It should be noted, however, in an alternative embodiment of the invention the amorphous region 310 is also located in the poly gate 240. If the amorphizing element is included at a high enough concentration, the amorphizing element breaks virtually all of the atomic bonds within the lattice structure of the semiconductor substrate 210. The breaking of the atomic bonds results from the transfer of kinetic energy from the amorphizing element to the silicon lattice. The amorphous region 310, in a subsequent step, allows for a more ideal distribution of the implanted dopant.

In an exemplary embodiment of the present invention, the amorphizing element is silicon or germanium having an implant dose of at least about $1E15$ atoms/cm$^2$ or at least about $1E14$ atoms/cm$^2$, respectively. It should be noted however that any other known or hereafter discovered amorphizing element may be used, and is within the scope of the present invention.

In one advantageous situation, the amorphizing element is implanted using an implanting power ranging from about 50 KeV to about 150 KeV. It should be noted, however, that the power used to implant the amorphizing element may vary, but it should be large enough to diffuse the amorphizing element to a depth great enough to encompass a subsequent diffusion of a channel dopant. In an exemplary embodiment, the channel dopant is diffused to a depth of about 100 nm, thus, the amorphizing element should be implanted to a depth ranging from about 180 nm to about 200 nm.

Figure 4:
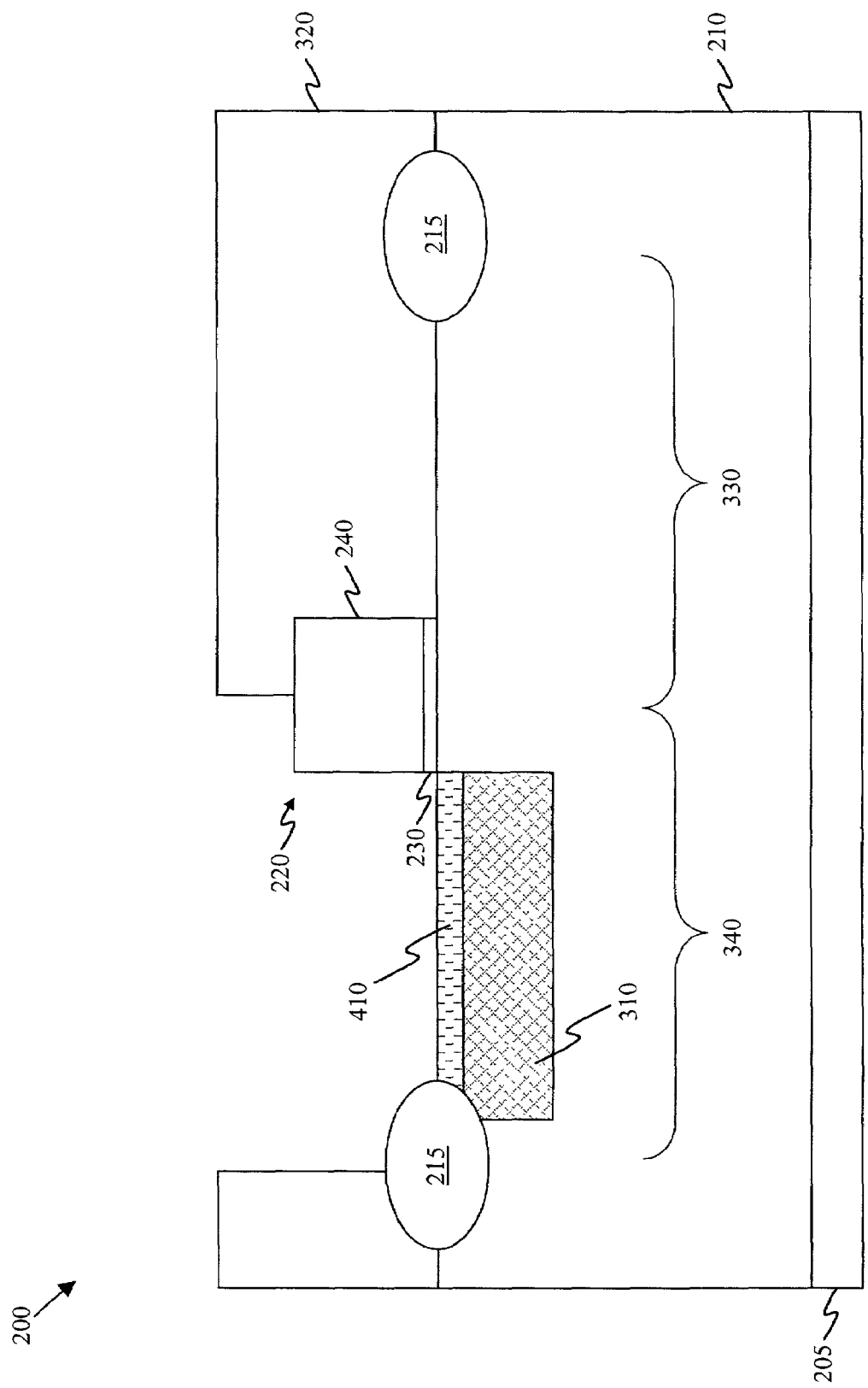
FIG. 4 illustrates the partially completed LDMOS device illustrated in FIG. 3, after diffusing a channel dopant laterally within the amorphous region, which is on a first side of the gate structure.

Turning to FIG. 4, illustrated is the partially completed LDMOS device 200 illustrated in FIG. 3, after implanting a channel dopant 410 within the amorphous region 310, the amorphous region 310 being located on the second side of the gate structure 340. In the illustrative embodiment, the channel dopant 410 may comprise a P-type dopant. Furthermore, in an exemplary embodiment, the channel dopant 410 maybe implanted having an implant dose ranging from about 1E12 atoms/cm$^2$ to about 1E14 atoms/cm$^2$.

As illustrated, the channel dopant 410 may be entirely contained within the amorphous region 310. As recited earlier, the channel dopant 410 maybe implanted to a depth of about 100 nm, therefore, for the channel dopant 410 to be entirely contained within the amorphous region 310, the amorphizing element should be implanted to a depth greater than about 120 nm, and more preferably, to a depth greater than about 180 nm. Similarly, it is desired to use the same photoresist portions 320 to form the amorphous region 310 as used to form the channel dopant 410. As a result, the amorphous region 310 and channel dopant 410 are typically formed in the same region.

Figure 5:
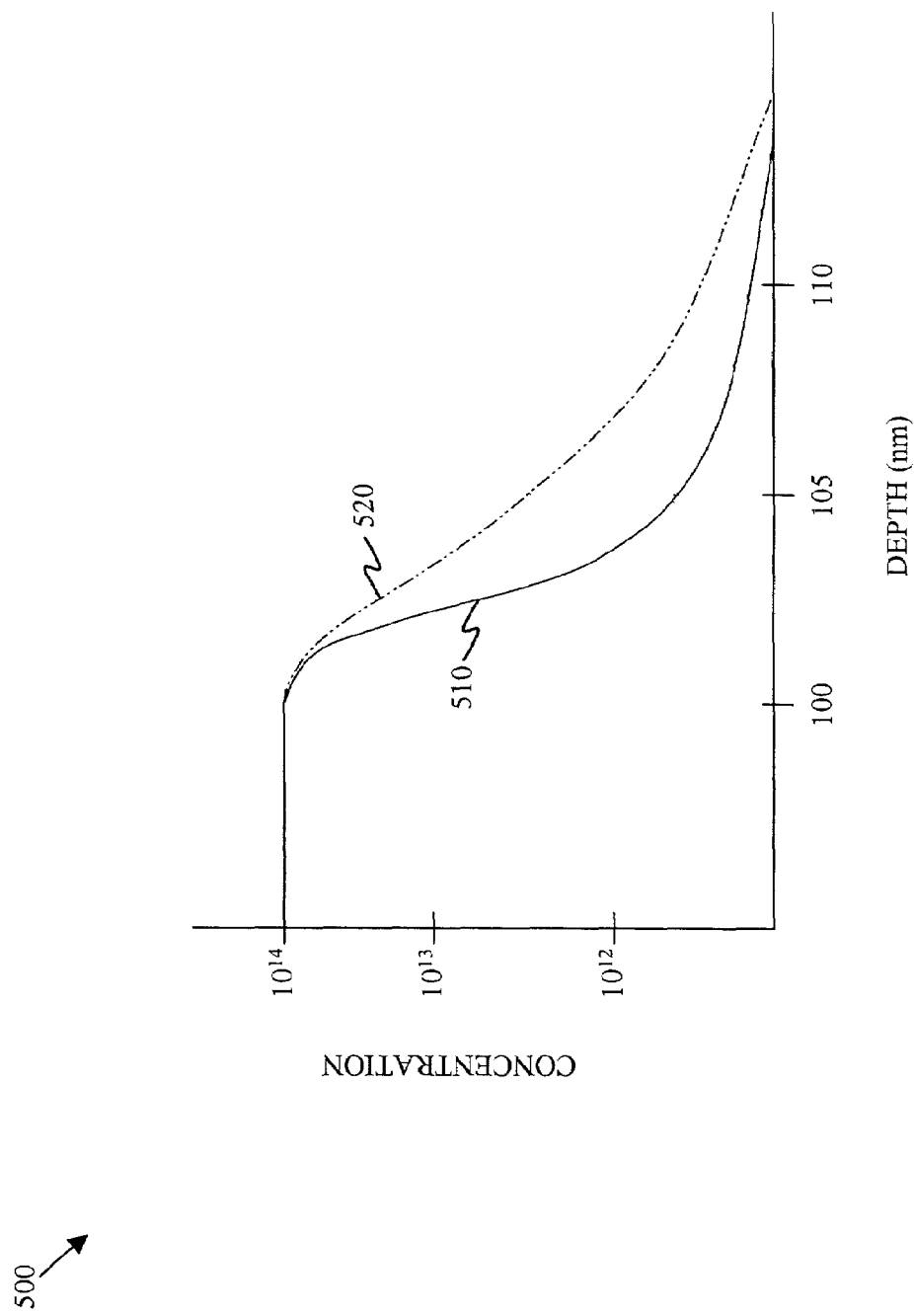
FIG. 5 illustrates a graph (for illustrative purposes only) that shows a concentration of the channel dopant at various depths for a situation where the amorphous region was employed (gaussian distribution) and a situation where the amorphous region was not employed(random distribution)

Because of the amorphous region 310, the channel dopant 410 may be included within the device 200, having an expected distribution, such as a gaussian distribution. Turning to FIG. 5, shown is a graph 500 (for illustrative purposes only) that illustrates a concentration of the channel dopant 410 at various depths for a situation where the amorphous region was employed 510 (gaussian distribution) and a situation where the amorphous region was not employed 520 (random distribution). As is illustrated, the situation where the amorphous region was employed 510 has a lower concentration at a depth equal to about 2 sigma (about 105 nm), than the region where the amorphous region was not employed 520. More specifically, in the embodiment illustrated, the concentrations may differ by up to about 1000 magnitudes at such a depth. Moreover, not only is the distribution expected, but it may be anticipated, which is in contrast to the prior art situation where the resulting profile is unknown. Because of the known desire to include the channel dopant 410 within the device 200 only where it is expected, one skilled in the art understands that the amorphous region 310 provides a substantial benefit. It should be noted that while the graph 500 was used as an example, the present invention should not be limited to the concentrations or depths included therein.

Figure 6:
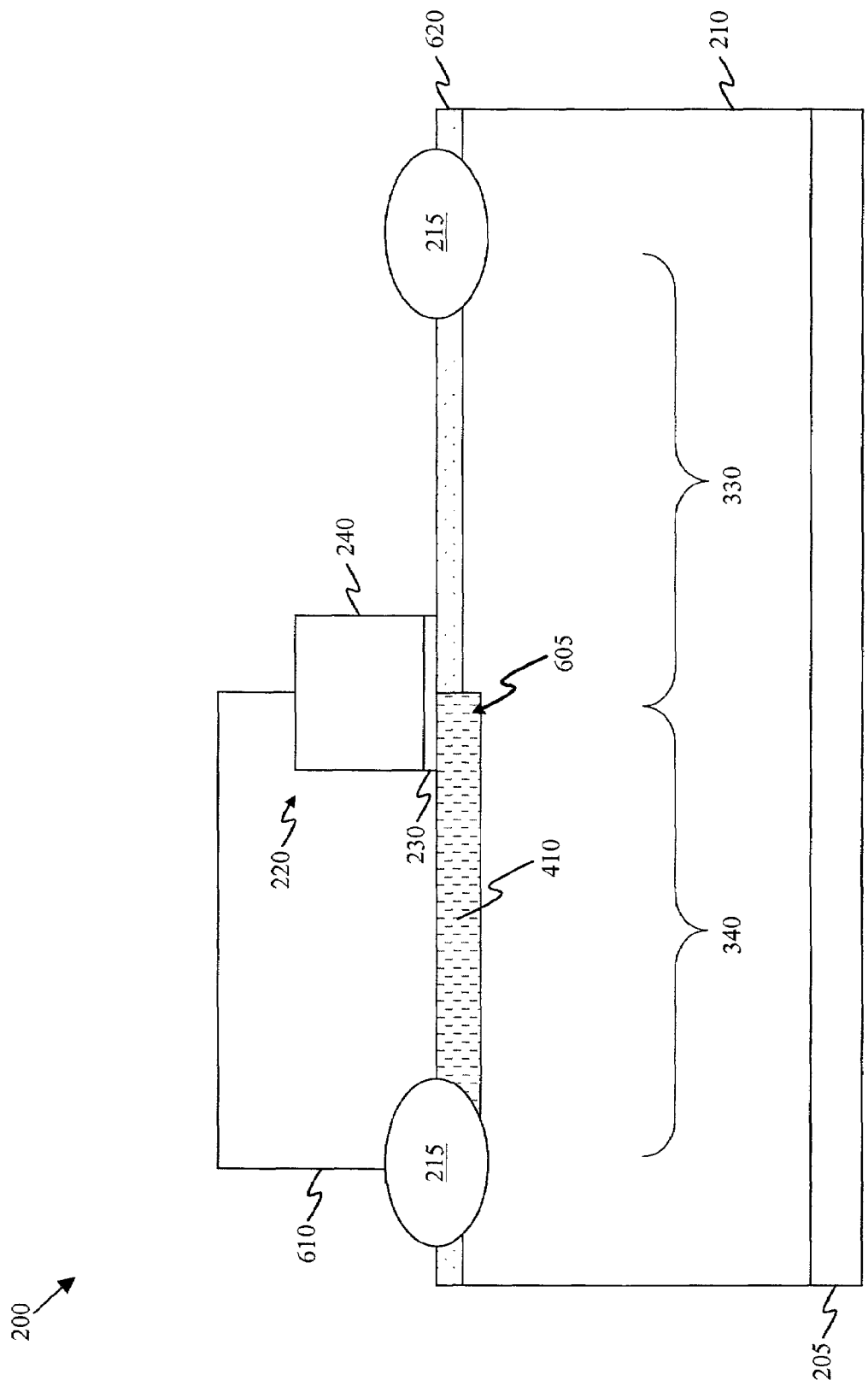
FIG. 6 illustrates the partially completed LDMOS device illustrated in FIG. 4, after removal of the photoresist portions, formation of new photoresist portions, and formation of a source/drain dopant in the semiconductor substrate and on a second side of the gate structure.

Turning to FIG. 6, subsequent to implanting the channel dopant 410 within the amorphous region 310, an anneal may be performed, diffusing the source/drain dopant 410 in other regions of the device. As may be noticed, a portion of the channel dopant 410 may diffuse under the gate structure 220, forming a first portion of the channel 605. Even after the diffusion of the channel dopant 410, it may maintain a substantially ideal profile. In an advantageous embodiment of the invention, the diffusion occurs at a temperature of greater than about 600° C. Furthermore, in an exemplary embodiment, the diffusion re-crystalizes the amorphous region 310 (FIG. 4) causing it to return nearly to its original pre-amorphous state. This particular embodiment is illustrated in FIG. 6 wherein no amorphous region 310 remains.

Also illustrated in FIG. 6 is the removal of the photoresist portions 320 (FIG. 4), formation of new photoresist portions 610, and formation of a source/drain dopant 620 in the semiconductor substrate 210 and on the first side of the gate structure 330. One skilled in the art understands how to remove the photoresist portions 320 and form the new photoresist portions 610. As illustrated, the new photoresist portions 610 maybe formed such that the second side of the gate structure 340 is protected.

After forming the new photoresist portions 610, the source/drain dopant 620 may be diffused laterally in the semiconductor substrate 210 and on the first side of the gate structure 330. As illustrated, the source/drain dopant 620 may be laterally diffused under the gate structure 220. In the embodiment disclosed above, where the channel dopant 410 is a P-type dopant, the source/drain dopant 620 maybe an N-type dopant, such as a phosphorous lightly doped source/drain dopant. It is desired for the source/drain dopant 620 to have an implant dose ranging from about 1E12 atoms/cm$^2$ to about 1E14 atoms/cm$^2$, however, in an exemplary embodiment of the present invention, the source/drain dopant 620 has an implant dose of about 5E12 atoms/cm$^2$. In an exemplary embodiment of the present invention, the source/drain dopant 620 has a depth of about 3000 nm.

Figure 7:
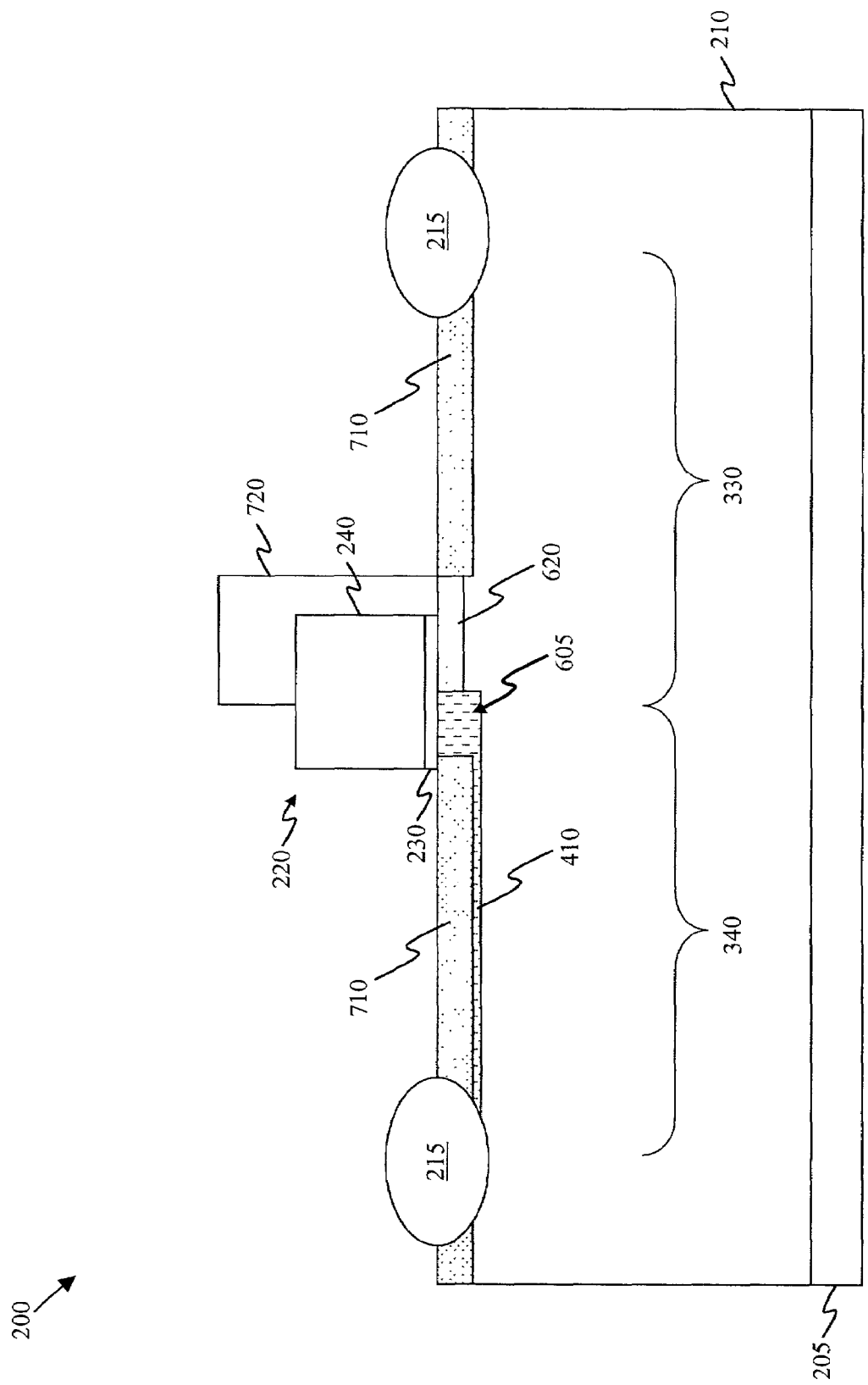
FIG. 7 illustrates the partially completed LDMOS device illustrated in FIG. 6, after placing a heavy concentration of the source/drain dopant on the first and second side of the gate.

Turning to FIG. 7, illustrated is the partially completed LDMOS device 200 illustrated in FIG. 6, after placing a heavy concentration of the source/drain dopant 710 on the first and second sides of the gate structure 330, 340. As illustrated, a photoresist portion 720 may be formed over a portion of the gate structure 220 and a portion of the first side of the gate structure 330, prior to diffusing the heavy concentration of the source/drain dopant 710. In such an instance, the heavy concentration of the source/drain dopant 710 may be placed a distance ranging from about 2000 nm to about 3000 nm from the gate structure 220 on the first side of the gate structure 330. In an exemplary embodiment, the heavy concentration 710 has an implant dose ranging from about 1E15 atoms/cm$^2$ to about 1E16 atoms/cm$^2$. After removing the photoresist portion 720, a device, similar to the LDMOS device 100 illustrated in FIG. 1, is achieved.

Figure 8:
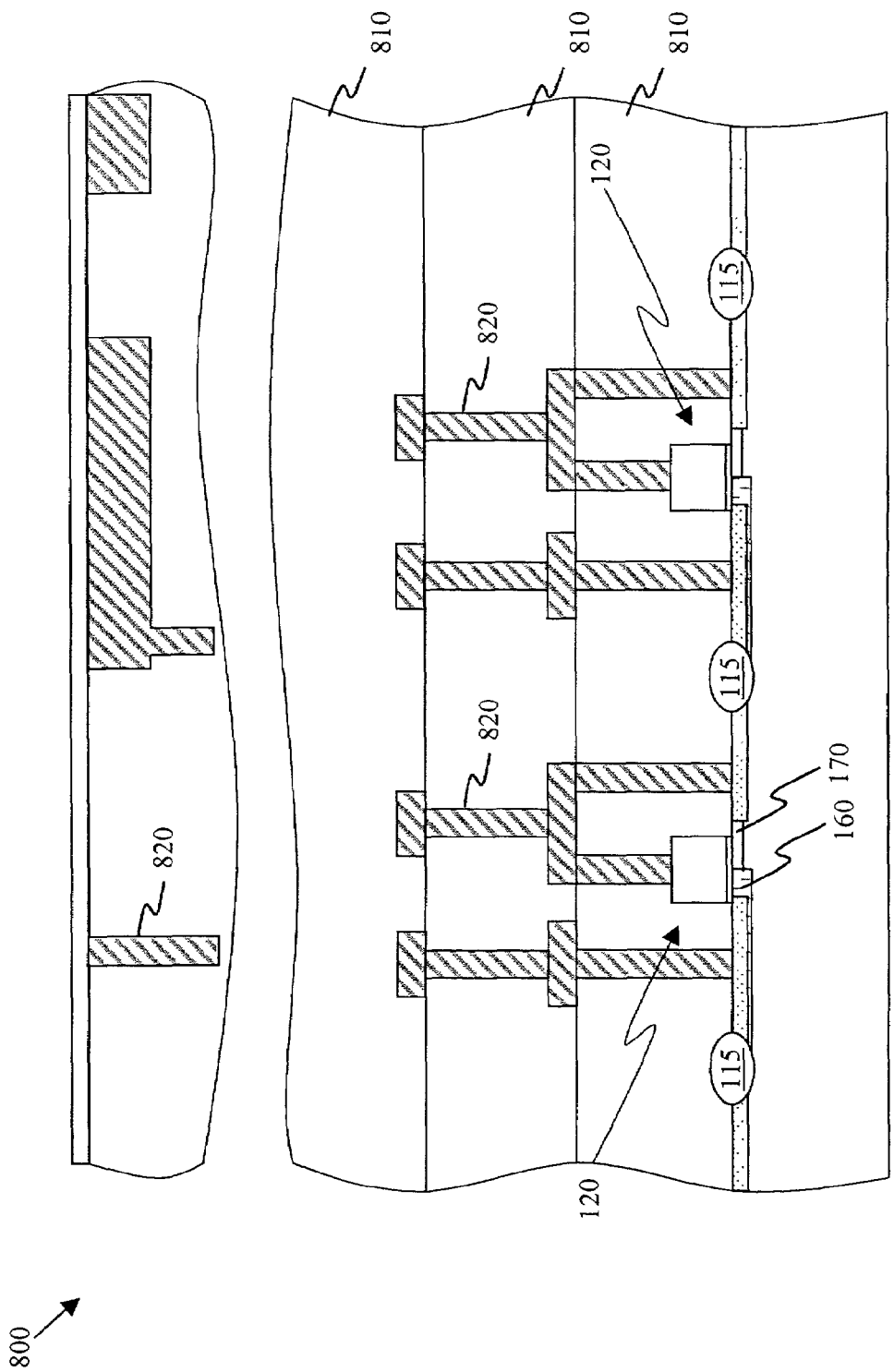
FIG. 8 illustrates a completed integrated circuit, which represents one environment in which the previously described method of manufacturing an LDMOS device could be used.

Turning briefly to FIG. 8, with continued reference to FIG. 1, illustrated is a completed integrated circuit 800, which represents one environment in which the previously described method of manufacturing a LDMOS device 100 could be used. The integrated circuit 800 may include laterally diffused metal oxide semiconductor (LDMOS) devices, traditional CMOS devices, bipolar CMOS (BiCMOS) devices, dynamic random access memory (DRAM) devices, electrically erasable programmable read-only memory (EEPROM) devices, including Flash EEPROMs, or any other type of similar device. Also shown in one advantageous embodiment of the integrated circuit 800, are components of the integrated circuit 800, including: isolation structures 115, the gate structure 120, the channel dopant 160, and the source/drain dopant 170. Also included in the completed integrated circuit 800 are dielectric layers 810, and interconnect structures 820 located within the dielectric layers 810, connecting the LDMOS devices 100 to form an operational integrated circuit 800.

Although the present invention has been described in detail, those skilled in the art should understand that they can make various changes, substitutions and alterations herein without departing from the spirit and scope of the invention in its broadest form.

What is claimed is:

1. A method of manufacturing a laterally diffused metal oxide semiconductor (LDMOS) device, comprising:
   forming isolation structures and a gate structure;
   forming an amorphous region in a semiconductor substrate between the isolation structures and adjacent the gate structure by implanting an amorphizing element in the semiconductor substrate; and diffusing a channel dopant laterally in the amorphous region to form a first portion of a channel.

2. The method as recited in claim 1 wherein implanting an amorphizing element includes implanting silicon.

3. The method as recited in claim 2 wherein implanting silicon includes implanting silicon with an implant dose of at least about 1E15 atoms/cm$^2$.

4. The method as recited in claim 1 wherein implanting an amorphizing element includes implanting germanium.

5. The method as recited in claim 4 wherein implanting germanium includes implanting germanium with an implant dose of at least about 1E14 atoms/cm$^2$.

6. The method as recited in claim 1 wherein diffusing a channel dopant laterally in the amorphous region includes diffusing a first P-type source/drain dopant to a depth of about 100 nm, and implanting an amorphizing element includes implanting an amorphizing element to a depth ranging from about 180 nm to about 200 nm.

7. The method as recited in claim 1 wherein diffusing a channel dopant laterally in the amorphous region includes diffusing a channel dopant on a first side of the gate structure and further including diffusing a source/drain dopant laterally in the semiconductor substrate and on a second side of the gate structure.

8. The method as recited in claim 1 wherein diffusing a channel dopant includes diffusing a channel dopant at a temperature above about 600° C. that re-crystallizes the amorphous region.

9. The method as recited in claim 1 wherein diffusing a channel dopant includes diffusing a channel dopant having a gaussian distribution within the amorphous region.

10. The method as recited in claim 1 wherein forming an amorphous region includes forming an amorphous region using an energy ranging from about 50 KeV to about 150 KeV.

11. A method of manufacturing an integrated circuit, comprising:
fabricating laterally diffused metal oxide semiconductor (LDMOS) transistors, including:
forming isolation structures and a gate structure;
forming an amorphous region in a semiconductor substrate between the isolation structures and adjacent the gate structure by implanting an amorphizing element in the semiconductor substrate; and
diffusing a channel dopant laterally in the amorphous region to form a first portion of a channel;
depositing interlevel dielectric layers over the LDMOS transistors; and
creating interconnect structures in the interlevel dielectric layers that interconnect the LDMOS transistors to form an operative integrated circuit.

12. The method as recited in claim 11 wherein implanting an amorphizing element includes implanting silicon.

13. The method as recited in claim 12 wherein implanting silicon includes implanting silicon with an implant dose of at least about 1E15 atoms/cm$^2$.

14. The method as recited in claim 11 wherein implanting an amorphizing element includes implanting germanium.

15. The method as recited in claim 14 wherein implanting germanium includes implanting germanium with an implant dose of at least about 1E14 atoms/cm$^2$.

16. The method as recited in claim 11 wherein diffusing a channel dopant laterally in the amorphous region includes diffusing a first P-type dopant to a depth of about 100 nm, and implanting an amorphizing element includes implanting an amorphizing element to a depth ranging from about 180 nm to about 200 nm.

17. The method as recited in claim 11 wherein diffusing a channel dopant laterally in the amorphous region includes diffusing a channel dopant on a first side of the gate structure and further including diffusing a source/drain dopant laterally in the semiconductor substrate and on a second side of the gate structure.

18. The method as recited in claim 11 wherein diffusing a channel dopant includes diffusing a channel dopant at a temperature above about 600° C. that re-crystallizes the amorphous region.

19. The method as recited in claim 11 wherein diffusing a channel dopant includes diffusing a channel dopant having a gaussian distribution within the amorphous region.

20. The method as recited in claim 11 wherein forming an amorphous region includes forming an amorphous region using an energy ranging from about 50 KeV to about 150 KeV.

* * * * *